United States Patent
Kang et al.

(10) Patent No.: US 11,823,926 B2
(45) Date of Patent: Nov. 21, 2023

(54) PROCESS MANAGEMENT METHOD AND APPARATUS

(71) Applicant: SAMSUNG SDS CO., LTD., Seoul (KR)

(72) Inventors: Ji Hoon Kang, Seoul (KR); A Hyang Han, Seoul (KR); Soon Mok Kwon, Seoul (KR); Min Sik Chu, Seoul (KR)

(73) Assignee: SAMSUNG SDS CO., LTD., Seoul (KR)

( * ) Notice: Subject to any disclaimer, the term of this patent is extended or adjusted under 35 U.S.C. 154(b) by 40 days.

(21) Appl. No.: 17/533,754

(22) Filed: Nov. 23, 2021

(65) Prior Publication Data

US 2022/0084853 A1 Mar. 17, 2022

Related U.S. Application Data

(62) Division of application No. 16/029,309, filed on Jul. 6, 2018, now Pat. No. 11,222,798.

(30) Foreign Application Priority Data

Aug. 9, 2017 (KR) .................. 10-2017-0101082

(51) Int. Cl.
*G05B 19/18* (2006.01)
*G05B 23/02* (2006.01)
(Continued)

(52) U.S. Cl.
CPC ........ *H01L 21/67253* (2013.01); *G05B 19/18* (2013.01); *G05B 23/0294* (2013.01); *H01L 22/10* (2013.01)

(58) Field of Classification Search
CPC .. G05B 19/18; G05B 23/024; G05B 23/0294; H01L 21/67253; H01L 22/10
See application file for complete search history.

(56) References Cited

U.S. PATENT DOCUMENTS

| 9,952,921 | B2 * | 4/2018 | Kim ...................... G06F 11/079 |
| 2007/0255442 | A1 * | 11/2007 | Nakamura ........... G05B 23/024 |
| | | | 700/108 |

(Continued)

FOREIGN PATENT DOCUMENTS

| JP | 2002-202811 A | 7/2002 |
| JP | 2007-535079 A | 11/2007 |

(Continued)

OTHER PUBLICATIONS

Communication dated Mar. 21, 2021 by the Korean Intellectual Property Office in counterpart Korean Patent Application No. 10-2017-0101082.

*Primary Examiner* — John E Breene
*Assistant Examiner* — Yaritza H Perez Bermudez
(74) *Attorney, Agent, or Firm* — Sughrue Mion, PLLC

(57) ABSTRACT

Provided is a method of managing a target process. The method performed by a process management apparatus includes: generating a reference pattern indicating a normal state based on reference observed data on a process factor measured while the target process is maintained in the normal state; obtaining observed data on the process factor measured for a specified observation period; calculating a dissimilarity between the reference pattern and the observed data; and constructing a regression tree for the target process by using the observed data and the dissimilarity, wherein the process factor is set as an independent variable of the regression tree, and the dissimilarity is set as a dependent variable of the regression tree.

13 Claims, 11 Drawing Sheets

(51) Int. Cl.
  *H01L 21/67* (2006.01)
  *H01L 21/66* (2006.01)

(56) References Cited

U.S. PATENT DOCUMENTS

| | | | | |
|---|---|---|---|---|
| 2012/0016824 A1* | 1/2012 | Kalinkin | ............... | G01M 15/14 |
| | | | | 706/12 |
| 2016/0078323 A1* | 3/2016 | Mikiyas | ............... | G06V 10/764 |
| | | | | 382/103 |
| 2016/0148850 A1* | 5/2016 | David | .................... | H01L 22/20 |
| | | | | 355/53 |
| 2019/0301979 A1* | 10/2019 | Kawanoue | ......... | G05B 23/0254 |

FOREIGN PATENT DOCUMENTS

| | | | |
|---|---|---|---|
| JP | 2013-25367 A | 2/2013 | |
| KR | 10-2014-0011064 A | 1/2014 | |
| KR | 10-2016-0033800 A | 3/2016 | |
| KR | 10-2016-0101705 A | 8/2016 | |

\* cited by examiner

OPTIMAL RULE A → "x3<2.199"  _,87

PROCESS MANAGEMENT METHOD AND APPARATUS

CROSS-REFERENCE TO RELATED APPLICATION(S)

This application is a divisional application of U.S. application Ser. No. 16/029,309, filed Jul. 6, 2018, which claims priority from Korean Patent Application No. 10-2017-0101082, filed on Aug. 9, 2017, in the Korean Intellectual Property Office, the disclosure of which is herein incorporated by reference in its entirety.

BACKGROUND

1. Field

The present inventive concept relates to a process management method and apparatus, and more particularly, to a process management method and apparatus employed to observe various process factors that affect the quality of a target process, detect an abnormality in the target process using observed values, and optimize the target process.

2. Description of the Related Art

In the semiconductor field, maintaining product quality and achieving yield goals are very important. Since the quality and yield of semiconductors are greatly affected by the state of process equipment that performs a wafer processing process, it is essential to diagnose and detect an abnormality early in the process in order to improve the yield of high-quality products. Therefore, various methods of quickly detecting an abnormality in a semiconductor process are being proposed.

As sensors for observing various process factors affecting product quality increase in the semiconductor field and related observation technologies are developed, the amount of observation data collected is increasing exponentially. Accordingly, a main paradigm of analysis of observed data is evolving from the perspective of descriptive analytics or predictive analytics that simply detects an abnormality in a process into the perspective of prescriptive analytics that detects a process factor which is the cause of a process abnormality, provides an analysis of an abnormal state, and, at the same time, provides a guide for process optimization.

As related technologies, methods such as model-based automated process control (MAPC) technology and run-to-run (R2R) control technology have been proposed.

However, the MAPC technology cannot provide an administrator with an intuitive guide for process optimization because it infers the relationship between a plurality of process factors that affect quality by mostly using a neural network model which is a black box-type model.

The R2R control technology is a technology that dynamically controls a process factor to follow a target value in each unit run. The R2R technology is widely used in modern industrial environments where environmental and mechanical characteristics of a process indicating a normal state change over time. However, since the R2R control technology obtains a target value of a process factor using a simple relational expression, it is difficult to obtain an accurate target value, and the complex interaction between process factors cannot be considered.

Therefore, there is a need for a method of providing an administrator with intuitive guide information for process management and accurately performing process management in consideration of the complicated interaction between process factors and the influence of each process factor.

SUMMARY

Aspects of the inventive concept provide a method of managing a target process by identifying a process factor that has a major influence on an abnormal state of the target process based on observed data on a plurality of process factors.

Aspects of the inventive concept also provide a method of generating a management rule for a target process in consideration of the interaction between a plurality of process factors and an individual influence index of each process factor and optimizing the target process based on the management rule and an apparatus for performing the method.

Aspects of the inventive concept also provide a method of providing guide information for process management, such as identification information of a process factor that has a major influence on an abnormal state of a target process and ruleset information indicating a normal state and the abnormal state of the target process, and an apparatus for performing the method.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an aspect of the inventive concept, there is provided a method of managing a target process using a process management apparatus, the method comprising: generating a reference pattern indicating a normal state based on reference observed data on a process factor measured while the target process is maintained in the normal state; obtaining observed data on the process factor measured for a specified observation period; calculating a dissimilarity between the reference pattern and the observed data; and constructing a regression tree for the target process by using the observed data and the dissimilarity, wherein the process factor is set as an independent variable of the regression tree, and the dissimilarity is set as a dependent variable of the regression tree.

According to another aspect of the inventive concept, there is provided a process management apparatus comprising: memory storing a plurality of instructions; and processor executing the plurality of instructions, wherein the plurality of instructions comprises: instructions for generating a reference pattern indicating a normal state based on reference observed data on a process factor measured while the target process is maintained in the normal state; instructions for obtaining observed data on the process factor measured for a specified observation period; instructions for calculating a dissimilarity between the reference pattern and the observed data; and instructions for constructing a regression tree for the target process by using the observed data and the dissimilarity, wherein the process factor is set as an independent variable of the regression tree, and the dissimilarity is set as a dependent variable of the regression tree.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, preferred embodiments of the present invention will be described with reference to the attached drawings. Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like numbers refer to like elements throughout.

Unless otherwise defined, all terms including technical and scientific terms used herein have the same meaning as commonly understood by one of ordinary skill in the art to which this invention belongs. Further, it will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. The terms used herein are for the purpose of describing particular embodiments only and is not intended to be limiting. As used herein, the singular forms are intended to include the plural forms as well, unless the context clearly indicates otherwise.

It will be understood that the terms "comprise" and/or "comprising" when used herein, specify some stated components, steps, operations and/or elements, but do not preclude the presence or addition of one or more other components, steps, operations and/or elements.

Prior to description of this specification, some terms to be used herein will be clarified.

In the present specification, process management can be understood as a comprehensive concept including observing process factors that may affect the quality of a target process in order to achieve a predetermined purpose, detecting an abnormality in the target process based on observed values, and controlling the target process to be optimized.

In the present specification, process factors can be understood as a comprehensive concept including all elements that can be observed by sensors. For example, in the field of semiconductors, the process factors may be set to factors that may affect the quality of a semiconductor, such as temperature, pressure, and humidity. Depending on the technical field, the process factors can be used interchangeably with terms such as process parameters, variables, observation factors, and parameters to refer to the same things.

Embodiments of the inventive concept will hereinafter be described in detail with reference to the accompanying drawings.

Figure 1:
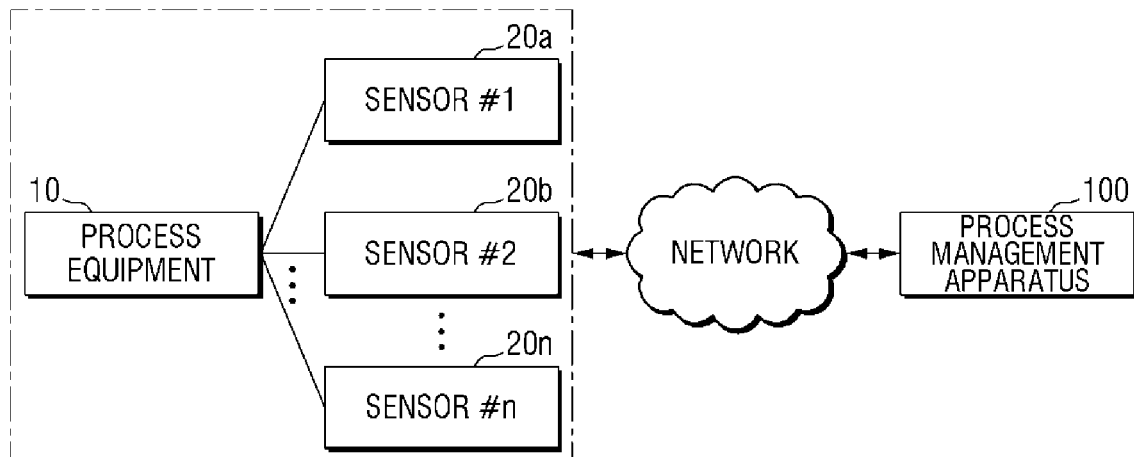
FIG. 1 illustrates the configuration of a process management system according to an embodiment of the inventive concept.

FIG. 1 illustrates the configuration of a process management system according to an embodiment of the inventive concept.

Referring to FIG. 1, the process management system is a system that observes a plurality of process factors such as temperature, humidity and pressure using sensors 20a through 20n, detects an abnormality in a target process (e.g., process equipment 10) based on observed data collected by the sensors 20a through 20n, and controls the target process to be performed in an optimized state. For example, the process management system may be an automatic process control (APC) system that controls a target process in real time in the semiconductor field.

In the current embodiment the process management system may be configured to include the sensors 20a through 20n and a process management apparatus 100. However, this is merely an embodiment for achieving the objectives of the inventive concept, and some components can be added or deleted as needed. In addition, it should be noted that the components of the process management system illustrated in FIG. 1 are functionally distinct components and that one or more components can be integrated with each other in an actual physical environment. Each component of the process management system will now be described.

In the process management system, the sensors 20a through 20n are devices for observing a plurality of process factors that may affect a target process. The sensors 20a through 20n may provide observed data on the process factors to the process management apparatus 100.

In the process management system, the process management apparatus 100 is a computing device that can monitor and control a target process overall. Here, the computing device may be implemented as a device such as a notebook computer, a desktop computer, or a laptop computer. However, the computing device is not limited to these examples and can be implemented as any device including a computing unit and a communication unit.

According to an embodiment of the inventive concept, the process management apparatus 100 may perform process management using a multivariate management technique in order to consider the correlation between process factors. The current embodiment will be further described with reference to FIG. 2.

Figure 2:
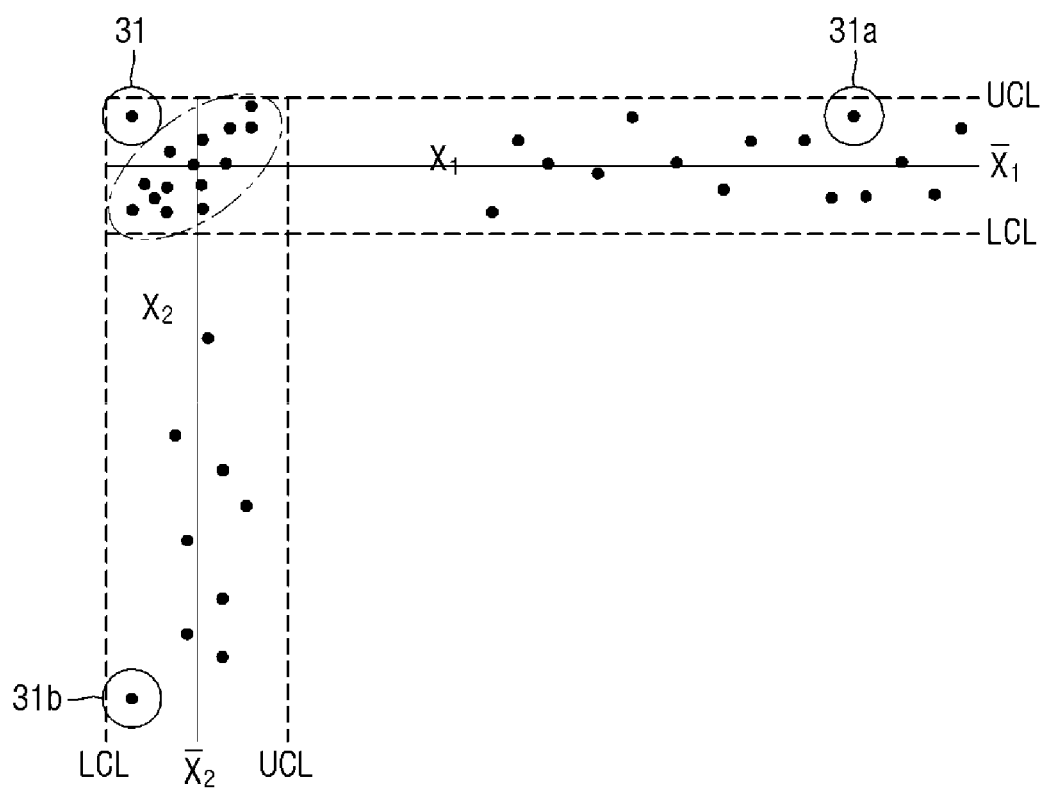
FIG. 2 is a diagram for explaining a multivariate management technique that can be referred to in some embodiments of the inventive concept.

FIG. 2 is a diagram for comparing a case where process management is performed using a univariate control chart for each of two process factors X1 and X2 and a case where process management is performed using a multivariate control chart according to the current embodiment. In FIG. 2, "LCL" and "UCL" represent a lower control limit and an upper control limit, respectively. In particular, a T-squared ($T^2$) control chart is illustrated as an example from among multivariate control charts.

Referring to FIG. 2, observed data 31a and 31b are all in a normal range in the univariate control chart. Therefore, an abnormal signal is not venerated. In the $T^2$ control chart, however, since the correlation between process factors included in observed data 31 is taken into consideration, the observed data 31 is sensed to correspond to an outlier outside the normal range. Therefore, the process management apparatus 100 using a multivariate management technique can easily detect a process abnormality that is difficult to detect using a univariate management technique.

Figure 3:
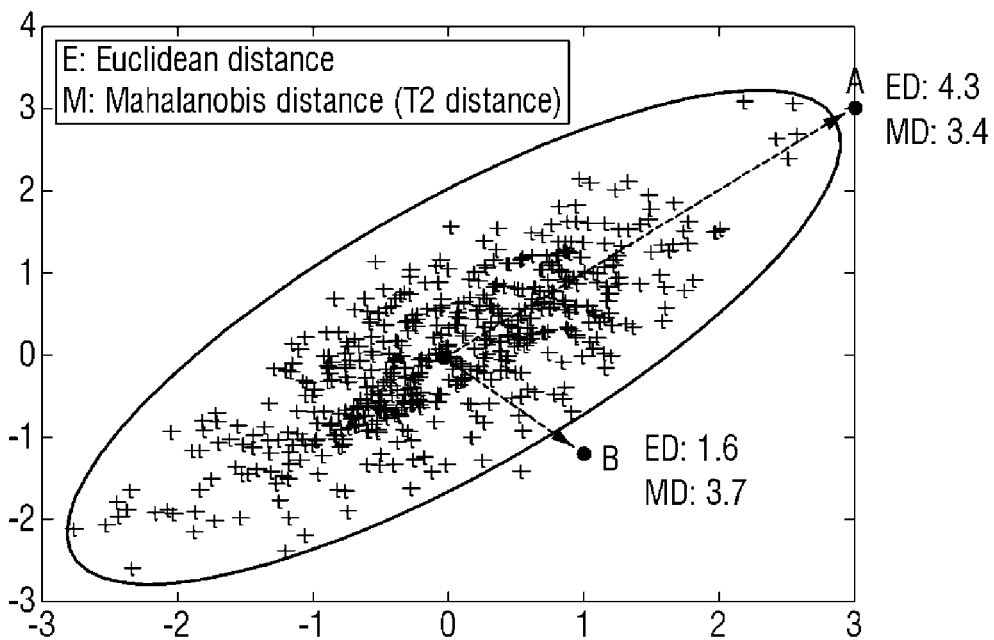
FIG. 3 is a diagram for explaining a T-squared ($T^2$) statistic that can be referred to in some embodiments of the inventive concept.

In order to facilitate understanding, the $T^2$ control chart will be briefly described. The $T^2$ control chart refers to a multivariate management technique that manages a process based on Hotelling's $T^2$ statistic. Here, the $T^2$ statistic is one statistic into which measured values of a plurality of process factors are summarized. The $T^2$ statistic can be understood as a value indicating how far an observed value is from a mean vector indicating a reference distribution e.g., a distribution of normal data). More specifically, the $T^2$ statistic refers to a Mahalanobis distance between a mean vector and an observed value. The Mahalanobis distance is different from a Euclidean distance in that it is a value calculated by further taking into consideration the variance of the reference distribution. Therefore, referring to FIG. 3, an observed value B, which is at a closer distance based on the Euclidean distance, may be at a greater distance based on the Mahalanobis distance.

In the multivariate management technique, the correlation or interaction between process factors can be considered overall, but analysis logic is required to identify an individual influence index of each process factor. Here, the individual influence index can be understood as the degree of influence of a process factor on a target process.

Figure 4:
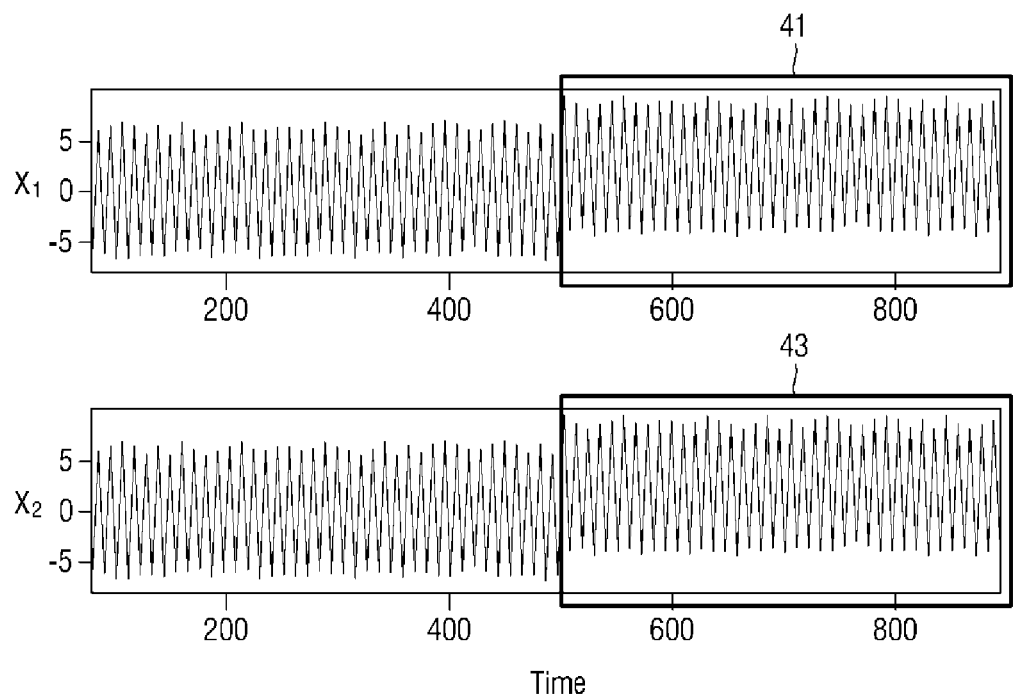
FIGS. 4 and 5 are diagrams for explaining a limit in a $T^2$ control chart.
Figure 5:
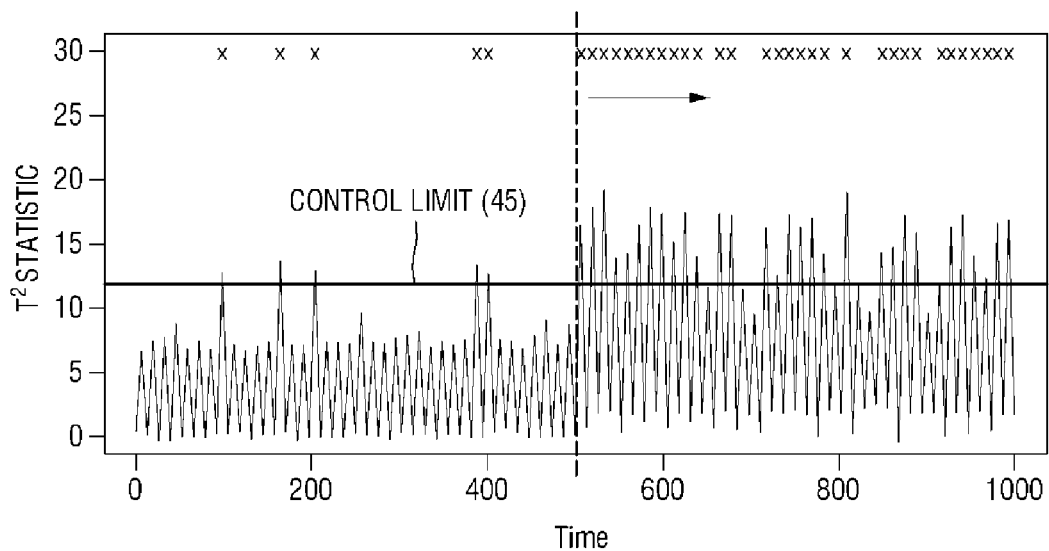

For example, referring to observed data on process factors X1 and X2 illustrated in FIG. 4 and a $T^2$ control chart illustrated in FIG. 5, drift patterns 41 and 43 are observed from about $500^{th}$ observed values of the process factors X1 and X2, and thus an abnormal phenomenon of exceeding a control limit 45 is detected in the $T^2$ control chart. However, since the $T^2$ statistic provides only one summarized statistical information, the individual influence index of each of the process factors X1 and X2 cannot be identified in the $T^2$ control chart. Furthermore, if the respective observed values of the process factors X1 and X2 are similar as illustrated in FIG. 4, an administrator of a target process cannot effectively manage the target process because he or she cannot identify a process factor that has a major influence on the target process from among the process factors X1 and X2. Therefore, analysis logic is needed to identify a process factor that has a major influence on an abnormal state of the target process and to provide guide information for process management to the administrator.

For reference, the control limit 45 illustrated in FIG. 5 can be set in various ways. For example, assuming that observed data follows a multivariate normal distribution, the $T^2$ statistic will follow F-distribution. Therefore, the control limit may be set based on the F-distribution. A method of setting a control limit based on the F-distribution is obvious to those of ordinary skill in the art, and thus a description of the method will be omitted. The description will be continued with reference to FIG. 1 again.

According to an embodiment of the inventive concept, the process management apparatus 100 may identify a process factor that has a major influence on a process abnormality using a regression tree constructed based on observed data and may provide intuitive guide information process management to an administrator. Here, the guide information may include an individual influence index of each process factor, a normal ruleset indicating a normal state, an abnormal ruleset indicating an abnormal state, and the like. In addition, since the regression tree, by its nature, can be intuitively analyzed, it may be included in the guide information. A detailed description of the current embodiment will be given later with reference to FIGS. 8 through 16.

According to an embodiment of the inventive concept, the process management apparatus 100 may alert the administrator when detecting an abnormality using a ruleset which is structured guide information and may automatically control a target process to be optimized. This will be described in detail later with reference to FIG. 17.

In the process management system illustrated in FIG. 1, the process management apparatus 100 may receive observed data from various sensors 20a through 20n through a network. Here, the network may be implemented as any kind of wired/wireless network such as a local area network (LAN), a wide area network (WAN), a mobile radio communication network, or a wireless broadband Internet (Wibro).

Until now, the process management system according to the embodiment of the inventive concept has been described with reference to FIGS. 1 through 5. The configuration and operation of a process management apparatus 100 according to an embodiment of the inventive concept will now be described with reference to FIGS. 6 and 7.

Figure 6:
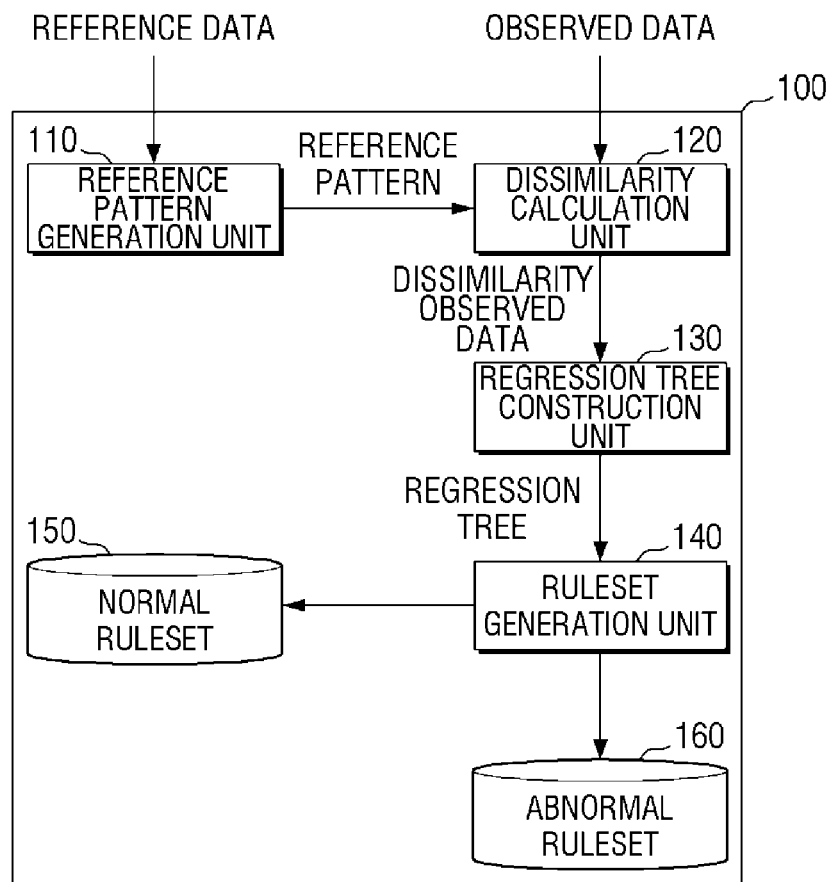
FIG. 6 is a block diagram of a process management apparatus according to an embodiment of the inventive concept.

FIG. 6 is a block diagram of a process management apparatus 100 according to an embodiment of the inventive concept.

Referring to FIG. 6, the process management apparatus 100 may be configured to include a reference pattern generation unit 110, a dissimilarity calculation unit 120, a regression tree construction unit 130, and a ruleset generation unit 140. In FIG. 6, components only related to the embodiment of the inventive concept are illustrated. Therefore, it will be understood by those of ordinary skill in the art to which the inventive concept pertains that other general-purpose components can be included in addition to the components illustrated in FIG. 6. In addition, it should be noted that the components of the process management apparatus 100 illustrated in FIG. 6 are functionally distinct components and that one or more components can be integrated with each other in an actual physical environment.

Referring to each component, the reference pattern generation unit 110 generates a reference pattern based on which dissimilarity is calculated. For example, the reference pattern generation unit 110 may generate a reference pattern indicating a normal state by using reference observed data observed while a target process is maintained in the normal state. Alternatively, the reference pattern generation unit 110 may generate the reference pattern using reference observed data on an abnormal state. Unless otherwise stated, the reference pattern will be assumed as a pattern indicating the normal state. A method by which the reference pattern generation unit 110 generates the reference pattern will be described in detail later with reference to FIG. 8.

The dissimilarity calculation unit 120 calculates the dissimilarity between the reference pattern and observed data.

A method of calculating the dissimilarity will be described in detail later with reference to FIG. 8.

The regression tree construction unit 130 constructs a regression tree using observed data and dissimilarity. According to an embodiment of the inventive concept, the regression tree construction unit 130 may construct the regression tree by setting process factors of the observed data as independent variables and setting the dissimilarity as a dependent variable. The construction of the regression tree will be described in detail later with reference to FIGS. 8, 10 and 11.

The ruleset generation unit 140 generates various kinds of rulesets using a regression tree. For example, the ruleset generation unit 140 may generate a normal ruleset 150 indicating the normal state of a target process and an abnormal ruleset 160 indicating the abnormal state of the target process. A method by which the ruleset generation unit 140 generates a ruleset from a regression tree will be described in detail later with reference to FIGS. 8 and 13 through 16.

Figure 9:
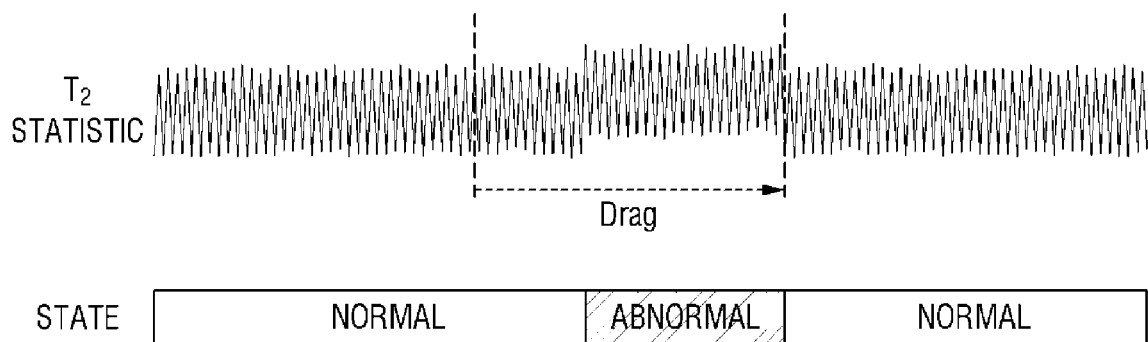
FIG. 9 illustrates an exemplary user interface that can be referred to in some embodiments of the inventive concept.
Figure 11:
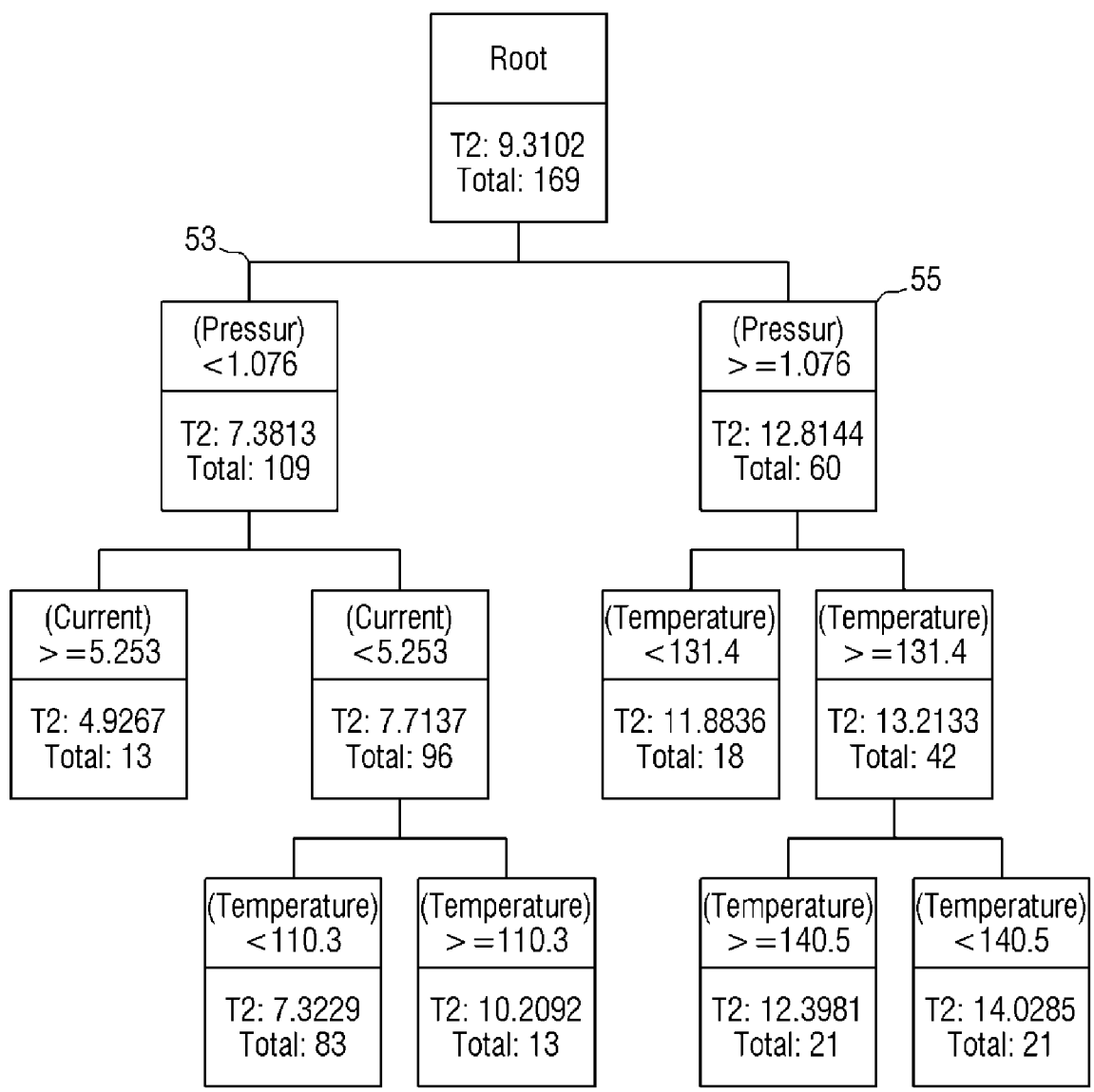

According to an embodiment of the inventive concept, the process management apparatus 100 may further include a user interface unit (not illustrated). The user interface unit (not illustrated) may receive various information necessary for process management from an administrator through a graphic user interface (GUI). Alternatively, the administrator may provide various guide information necessary for process management. An example of the GUI is illustrated in FIGS. 9 and 11.

According to an embodiment of the inventive concept, the process management apparatus 100 may further include a control unit (not illustrated). The control unit (not illustrated) may detect an abnormality in a target process in real time using the normal ruleset 150 and/or the abnormal ruleset 160 or may control process factors so that the target process is maintained in an optimized state. For example, when detecting observed data that exceeds a control limit, the control unit (not illustrated) may determine a target process to be in the abnormal state and alert the administrator. Alternatively, when observed data satisfies the abnormal ruleset 160, the control unit (not illustrated) may determine the target process to be in the abnormal state and alert the administrator. The control unit (not illustrated) will be further described later with reference to FIG. 17.

Each component of the process management apparatus 100 illustrated in FIG. 6 may be, but is not limited to, a software component or a hardware component such as a Field Programmable Gate Array (FPGA) or Application Specific Integrated Circuit (ASIC). A component may advantageously be configured to reside on the addressable storage medium and configured to execute on one or more processors. The functionality provided for in the components may be further separated into additional components or combined into a single component that performs certain functions.

Figure 7:
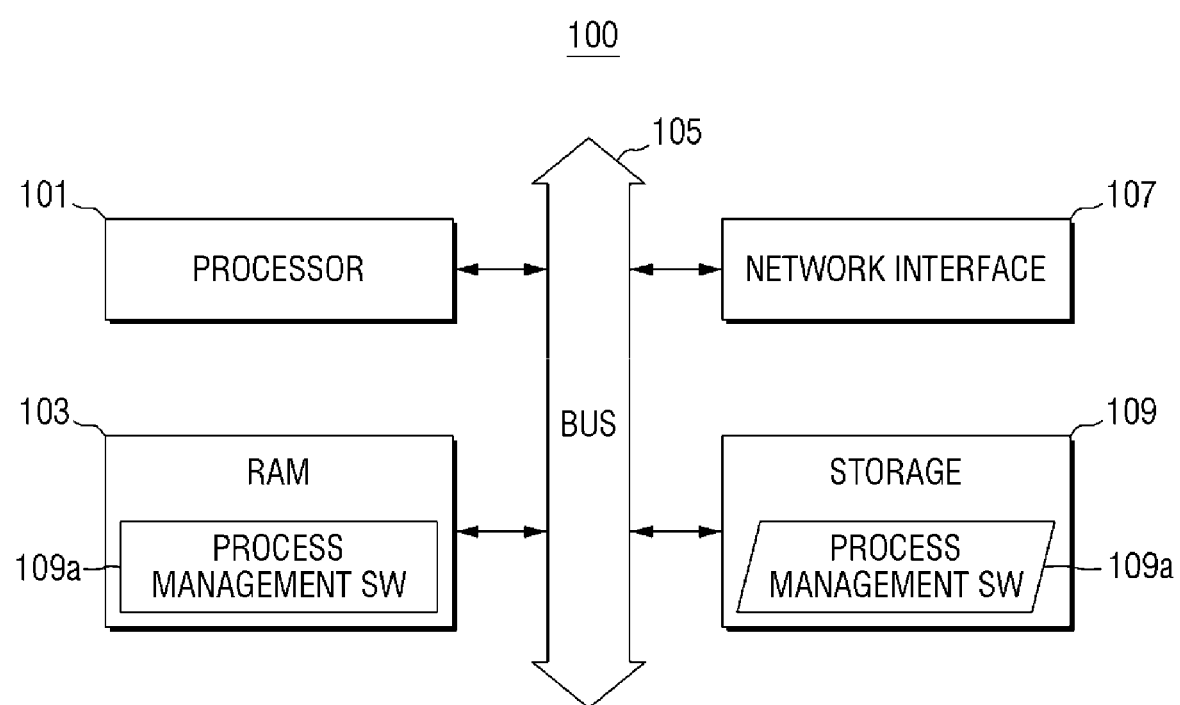
FIG. 7 illustrates the hardware configuration of a process management apparatus according to an embodiment of the inventive concept.

FIG. 7 illustrates the hardware configuration of a process management apparatus 100 according to an embodiment of the inventive concept.

Referring to FIG. 7, the process management apparatus 100 may include one or more processors 101, a bus 105, a network interface 107, a memory 103 which loads a computer program to be executed by the processors 101, and a storage 109 which stores process management software 109a. In FIG. 7, components only related to the embodiment of the inventive concept are illustrated. Therefore, it will be understood by those of ordinary skill in the art to which the inventive concept pertains that other general-purpose components can be included in addition to the components illustrated in FIG. 7.

The processors 101 control the overall operation of each component of the process management apparatus 100. The processors 101 may include a central processing unit (CPU), a micro-processor unit (MPU), a micro-controller unit (MCU), a graphic processing unit (GPU), or any form of processor well known in the art to which the inventive concept pertains. In addition, the processors 101 may perform an operation on at least one application or program for executing a method according to embodiments of the inventive concept. The process management apparatus 100 may include one or more processors.

The memory 103 stores various data, commands and/or information. The memory 103 may load one or more programs 109a from the storage 109 to execute a process management method according to embodiments. In FIG. 7, a random access memory (RAM) is illustrated as an example of the memory 103.

The bus 105 provides a communication function between the components of the process management apparatus 100. The bus 105 may be implemented as various forms of buses such as an address bus, a data bus and a control bus.

The network interface 107 supports wired and wireless Internet communication of the process management apparatus 100. In addition, the network interface 107 may support various communication methods as well as Internet communication. To this end, the network interface 107 may include a communication module well known in the art to which the inventive concept pertains.

The storage 109 may non-temporarily store reference observed data observed when a target process is in a normal state, observed data on process factors measured during a specified observation period, and the programs 109a. In FIG. 7, the process management software 109a is illustrated as an example of the programs 109a.

The storage 109 may include a non-volatile memory such as a read only memory (ROM), an erasable programmable ROM (EPROM), an electrically erasable programmable ROM (EEPROM) or a flash memory, a hard disk, a removable disk, or any form of computer-readable recording medium well known in the art to which the inventive concept pertains.

The process management software 109a may perform a process management method according to an embodiment of the inventive concept. Specifically, the process management software 109a may be loaded into the memory 103 and executed by the processors 101 to perform an operation of generating a reference pattern indicating the normal state based on the reference observed data, an operation of calculating the dissimilarity between the reference pattern and the observed data, and an operation of constructing a regression tree for the target process by using the observed data and the dissimilarity.

Until now, the configuration and operation of the process management apparatus 100 according to the embodiment of the inventive concept have been described with reference to FIGS. 6 and 7. A process management method according to an embodiment of the inventive concept will now be described in detail with reference to FIGS. 8 through 16.

Each operation included in the process management method according to the embodiment of the inventive concept may be performed by a computing device. The computing device may be, for example, the process management apparatus 100. However, the subject of each operation included in the process management method may be omitted for ease of description. In addition, each operation included in the process management method may be an operation performed by the process management apparatus 100 as the process management software 109a is executed by the processors 101.

Figure 8:
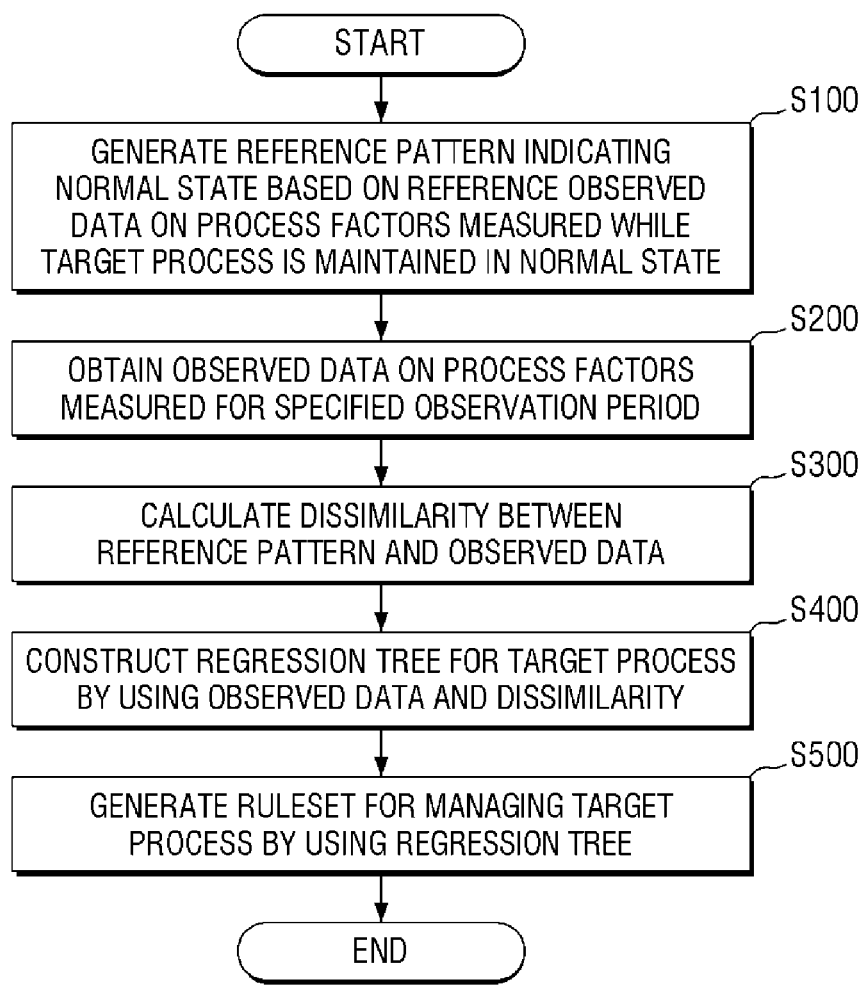
FIG. 8 is a first flowchart illustrating a process management method according to an embodiment of the inventive concept.

FIG. 8 is a flowchart illustrating a process management method according to an embodiment of the inventive concept. However, this is merely an embodiment for achieving the objectives of the inventive concept, and some operations can be added or removed if necessary.

Referring to FIG. 8, the process management apparatus 100 generates a reference pattern indicating a normal state based on reference observed data on process factors measured while a target process is maintained in the normal state (operation S100). Here, the reference pattern may be a characteristic value representing the reference observed data and can be obtained in any way which may vary depending on a dissimilarity calculation method.

For example, when dissimilarity is calculated based on the $T^2$ statistic, the reference pattern may be calculated as a mean vector of the reference observed data. In another example, when the dissimilarity is calculated based on the Euclidean distance, the reference pattern may be calculated as an average point of the reference observed data or a centroid of a cluster of the reference observed data. In another example, when the dissimilarity is calculated based on a model residual, the reference pattern may be a machine learning model, a statistical model, or the like constructed based on the reference observed data.

According to an embodiment of the inventive concept, the reference observed data may be updated to latest data at a specified time or in predetermined cycles. In addition, the reference pattern may be generated again using the updated reference observed data. This is intended to reflect the fact that internal and external factors that affect the quality of the target process can change over time. For example, in a semiconductor process, a temperature range, a pressure range, etc. indicating that a process is in the normal state can vary according to changes in the external environment. According to the current embodiment, since the reference pattern can be adaptively updated according to the internal and external factors that can change dynamically, process management can be effectively performed even in a dynamic environment such as a modern industrial environment.

Next, the process management apparatus 100 obtains observed data on the process factors measured for a specified observation period (operation S200). For example, the process management apparatus 100 may receive the observed data from various sensors that measure the process factors of the target process.

In an embodiment, the specified observation period may be determined automatically by the process management apparatus 100. For example, the process management apparatus 100 may determine a period in which each unit process is performed as the observation period. In another example, when detecting an abnormal state of the target process, the process management apparatus 100 may determine a period including first observed data indicating the normal state and second observed data indicating the abnormal state as the observation period. In another example, when detecting the abnormal state of the target process, the process management apparatus 100 may determine a period including only observed data indicating the abnormal state as the observation period.

In the above-described embodiment, a case where the abnormal state is detected may be a case where dissimilarity to be described later exceeds a preset control limit or a case where observed data satisfies at least one rule included in an abnormal ruleset.

In an embodiment, the specified observation period may be set through a user interface provided by the process management apparatus 100. For example, the process management apparatus 100 may provide an exemplary user interface illustrated in FIG. 9 to an administrator. Through the exemplary user interface, the administrator may receive observation information such as the $T^2$ statistic and observed data on a plurality of process factors (X1 and X2). In this case, the administrator may designate a period including observed data to be analyzed as the observation period by, e.g., a dragging method as illustrated in FIG. 9. In FIG. 9, a period in which the state changes from the normal state to the abnormal state is set as the observation period in order to analyze the cause of the abnormal state.

Referring again to FIG. 8, the process management apparatus 100 calculates the dissimilarity between the observed data and the reference pattern (operation S300).

In an embodiment, the dissimilarity may be calculated based on the $T^2$ statistic, which is a multivariate management technique, in order to consider the correlation between a plurality of process factors.

In an embodiment, the dissimilarity may be calculated based on the Euclidean distance in order for simple implementation.

The dissimilarity may also be calculated based on a novelty score, a model residual, or the like. The dissimilarity can be calculated in any way as long as it can represent the difference between the observed data and the reference pattern.

Figure 10:
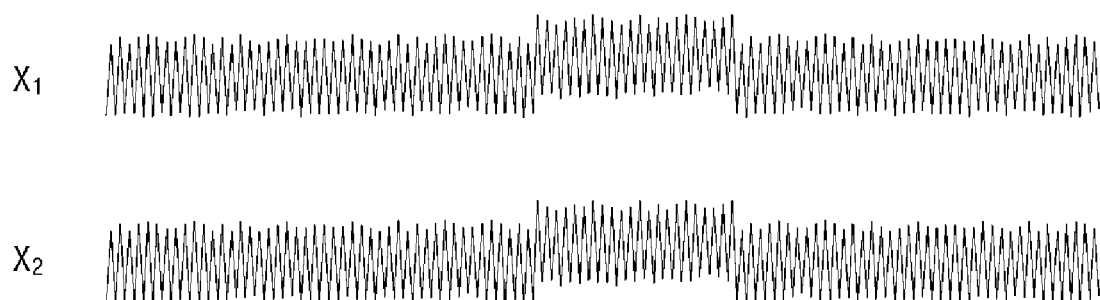
FIGS. 10 and 11 are diagrams for explaining a method of constructing a regression tree that can be referred to in some embodiments of the inventive concept.
Figure 10:
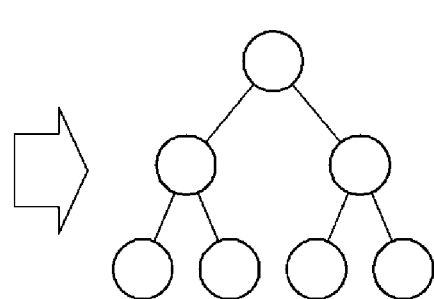

Next, the process management apparatus 100 constructs a regression tree for the target process by using the observed data and the dissimilarity (operation S400). Specifically, the process management apparatus 100 constructs a regression tree by setting each process factor as an independent variable and setting the dissimilarity as a dependent variable as illustrated in FIG. 10. Since the process management apparatus 100 does not construct a classification tree, which is an example of a decision tree, it constructs a regression tree by setting the dissimilarity as a dependent variable instead of setting the normal state and the abnormal state as dependent variables.

The process management apparatus 100 constructs a regression tree in such a manner that the variance of a dependent variable corresponding to each tree node is minimized. That is, the process management apparatus 100 constructs the regression tree in such a manner that information entropy of the observed data is minimized and the information gain of the observed data is maximized. Since this is a concept widely known in the art, a description thereof will be omitted. The process management apparatus 100 may also construct a regression tree using a regression tree construction algorithm (e.g., CART, GUIDE, M5, etc.) widely known in the art.

The variance of the dependent variable indicating the information entropy may be calculated according to Equation 1 below, and the information gain may be calculated according to Equation 2 below. In Equation 1, xc indicates an average value of a dependent variable corresponding to each tree node c, and yi indicates a dependent variable value for an $i^{th}$ piece of observed data from among observed data corresponding to each tree node.

$$SS = \sum_{c \in nodes} \sum_{i \in c} (y_i - \bar{x}_c)^2. \quad (1)$$

where $$\bar{x}_c = \frac{1}{n_c} \sum_{i \in c} y_i,$$

In addition, in Equation 2, j indicates a variable used for division, p indicates a division point, R0 indicates data before a tree node is divided, and R1 and R2 indicate data after the tree node is divided.

$$\underset{j,p}{\mathrm{argmin}} \left[ \sum_{x_i \in R_1(j,p)} ss_i + \sum_{x_i \in R_2(j,p)} ss_i - \sum_{x_i \in R_0} ss_i \right] \quad (2)$$

where $$R_1(j, p) = \{X \mid X_j \le p \text{ and } X \in R_0\},$$

$$R_2(j, p) = \{X \mid X_j > p \text{ and } X \in R_0\}$$

According to an embodiment, the process management apparatus 100 may perform a pruning process through cross validation in order to prevent over-fitting of the regression tree.

The regression tree constructed in operation S400 will be described later with reference to FIG. 11.

Referring again to FIG. 8, the process management apparatus 100 generates a ruleset for managing the target process by using the regression tree constructed in operation S400 (operation S500). The ruleset may include a normal ruleset indicating the normal state of the target process and an abnormal ruleset indicating the abnormal state of the target process. In addition, the ruleset is one of the guide information provided to the administrator. The ruleset can be utilized by the administrator for process management and can be utilized as reference information for automatically controlling each process factor. Operation S500 will be described in detail later with reference to FIGS. 12 through 17.

Until now, the process management method according to the embodiment of the inventive concept has been described with reference to FIGS. 8 through 10. According to the above-described method, a regression tree is constructed by setting a plurality of process factors as independent variables and setting the dissimilarity between a reference pattern and observed data as a dependent variable. Therefore, it is possible to generate a reliable ruleset that reflects the interaction between the process factors and an individual influence index of each process factor.

A regression tree that can be referred to in some embodiments of the inventive concept will now be described with reference to FIG. 11.

FIG. 11 illustrates an exemplary regression tree that can be constructed in operation S400. Specifically, FIG. 11 illustrates an exemplary regression tree constructed by setting process factors such as pressure, temperature and current as independent variables and setting dissimilarity based on the $T^2$ statistic as a dependent variable. The regression tree may be guide information provided to the administrator through a user interface.

Referring to FIG. 11, the regression tree may be composed of, e.g., a plurality of layers and a plurality of tree nodes, and the tree nodes may be divided based on a specific value of a process factor due to the nature of the regression tree. For example, it can be seen that a tree node 53 and a tree node 55 are divided based on a specific value (1.076) of a process factor (pressure).

Each tree node included in the regression tree may correspond to observed data that satisfies a specific condition for a process factor. For example, it can be seen that the tree node 53 corresponds to observed data with a pressure of "less than 1.076" and that the number of pieces of observed data corresponding to the tree node 53 is "109." In addition, it can be seen that an average dissimilarity value of the observed data corresponding to the tree node 53 is "7.3813." Since the regression tree can be understood clearly by those of ordinary skill in the art, a further description of the regression tree will be omitted.

A method of providing guide information for a target process based on a regression tree will now be described with reference to FIGS. 12 through 16.

According to an embodiment of the inventive concept, the process management apparatus 100 may provide, as guide information, information about a process factor that has a major influence on the abnormal state of a target process and about an individual influence index of each process factor. This will now be described with reference to FIG. 12.

Figure 12:
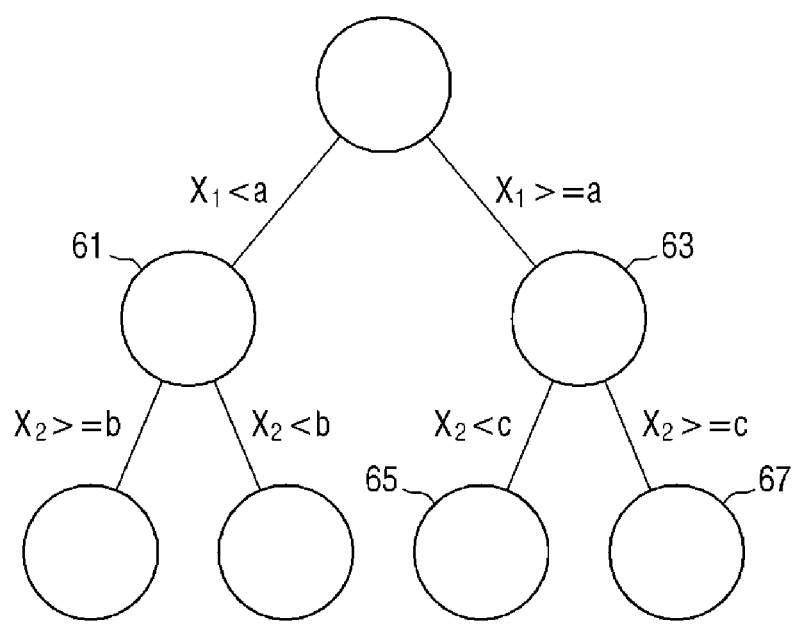
FIGS. 12 through 16 are diagrams for explaining a method of providing guide information for a target process based on a regression tree.

FIG. 12 illustrates an example of a regression tree that can be constructed in operation S400. Specifically, FIG. 12 illustrates a regression tree constructed by setting a first process factor X1 and a second process factor X2 as independent variables and using first observed data on the normal state and second observed data on the abnormal state.

When the regression tree is constructed as illustrated in FIG. 12, an individual influence index of each process factor X1 or X2 may be determined based on the order in which the process factors X1 and X2 are used to divide tree nodes of the regression tree. Specifically, it may be determined that the first process factor X1 used to divide tree nodes 61 and 63 located in a first layer has a higher individual influence index than the second process factor X2 used to divide tree nodes 65 and 67 located in a second layer. This is because, when a regression tree is constructed such that the variance value of dissimilarity, which is a dependent variable, is minimized, tree nodes are preferentially divided by a process factor that has the greatest influence on the dissimilarity.

Therefore, if the regression tree is constructed as illustrated in FIG. 12, the process management apparatus 100 may, when detecting a process abnormality, provide the administrator with guide information indicating that the first process factor X1 should be controlled prior to the second process factor X2. For reference, when tree nodes in the same layer are divided by different process factors, individual influence indices of the different process factors may be determined by comparing information values obtained from the division.

In addition, according to an embodiment of the inventive concept, the process management apparatus 100 may give a higher control priority to the first process factor X1 than to the second process factor X2 and, when detecting a process abnormality, may operate to preferentially control the first process factor X1.

Next, a method of generating a ruleset, which is structured guide information, based on a regression tree in operation S500 will be described with reference to FIGS. 13 through 16.

According to an embodiment of the inventive concept, the process management apparatus 100 does not generate a ruleset based on only terminal nodes of a regression tree, but generates a ruleset based on tree nodes selected according to various criteria. Therefore, a ruleset can be generated based on tree nodes located in a middle layer of the regression tree. Some embodiments in which the process management apparatus 100 generates a ruleset will now be described.

Figure 13:
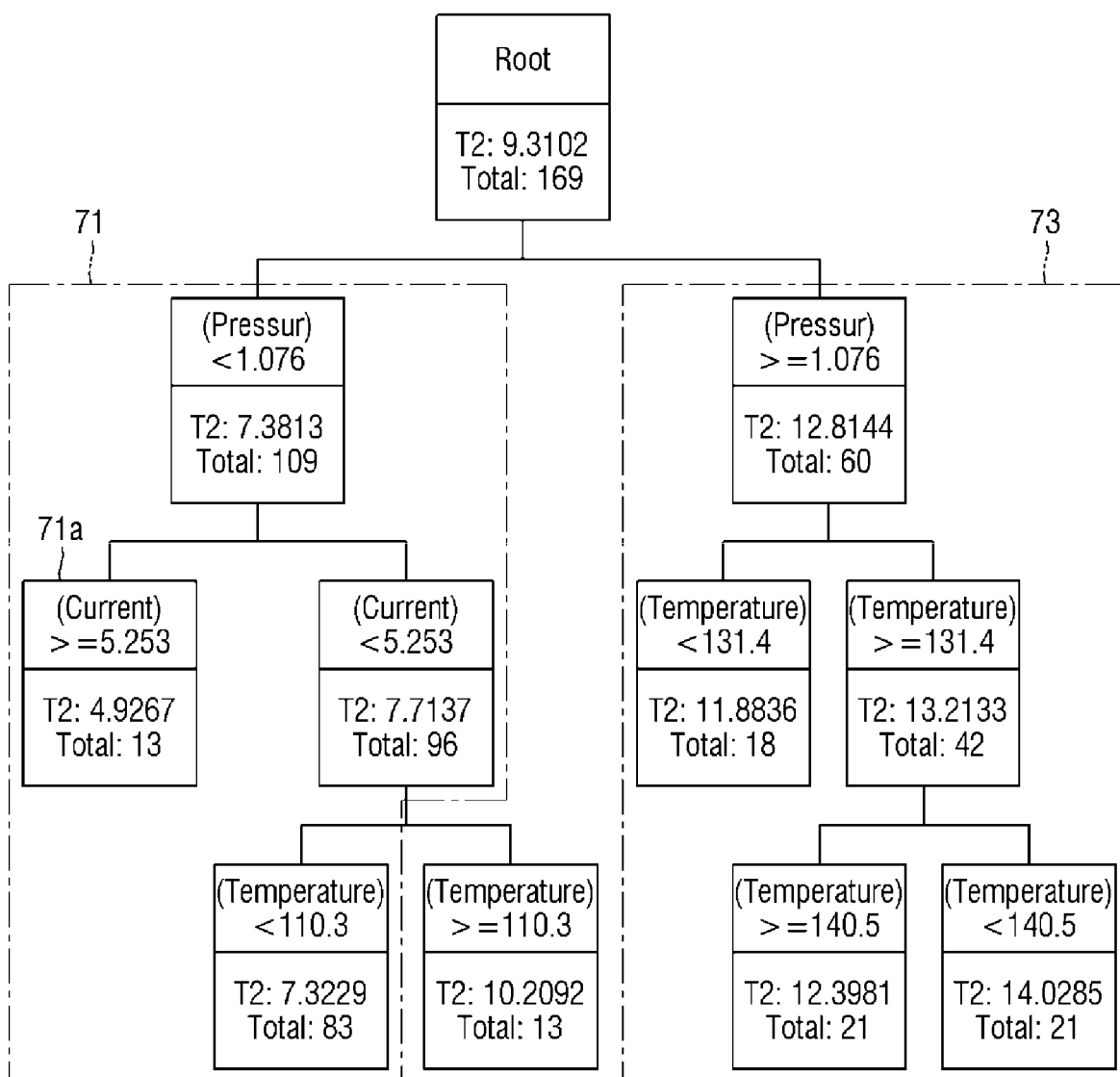

In an embodiment, the process management apparatus 100 may generate a normal ruleset indicating the normal state and an abnormal ruleset indicating the abnormal state based on an average dissimilarity value (e.g., a $T^2$ statistic) corresponding to each tree node included in a regression tree. For example, referring to FIG. 13, the process management apparatus 100 may generate a normal ruleset based on tree nodes 71 whose average dissimilarity values are equal to or less than a preset first threshold value and generate an abnormal ruleset based on tree nodes 73 whose average dissimilarity values are equal to or greater than a preset second threshold value. Here, the first threshold value and the second threshold value may be values determined based on, for example, a control limit. In FIG. 13, the first threshold value is "9," and the second threshold value is "11."

In addition, the process management apparatus 100 may provide, as an optimal rule, a rule generated based on a tree node having a smallest average dissimilarity value from among rules included in the normal ruleset. For example, an optimal rule may be generated based on a tree node 71a illustrated in FIG. 13 and may be generated as "if pressure <1.076 & current 5.253, then normal (optimal)." The optimal rule may be provided to the administrator as guide information and may be utilized as reference information for controlling a target process. For example, the process management apparatus 100 may control observed values of process factors to be included in the range of the optimum rule in a subsequent process.

In an embodiment, the process management apparatus 100 may select tree nodes whose corresponding average dissimilarity values exceed a preset control limit from among tree nodes included in a regression tree and generate an abnormal ruleset indicating the abnormal state of a target process using the selected tree nodes. In addition, the process management apparatus 100 may monitor the target process based on the abnormal ruleset and alert the administrator.

In an embodiment, the process management apparatus 100 may select tree nodes based on the average and degree of deviation (e.g., variance or standard deviation) of dissimilarity values corresponding to each tree node of a regression tree and generate a normal ruleset and/or an abnormal ruleset based on the selected tree nodes. For example, the process management apparatus 100 may select tree nodes whose weighted sums of the average and variance of dissimilarity values are equal to or less than a threshold value and generate a normal ruleset using the selected tree nodes. In another example, the process management apparatus 100 may select candidate nodes from among the tree nodes included in the regression tree based on the average of dissimilarity values and generate a normal ruleset or an abnormal ruleset based on tree nodes whose variances of dissimilarity values are equal to or less than a threshold value from among the candidate nodes. According to the current embodiment, since the degree of deviation of dissimilarity values is further considered, a more reliable ruleset can be generated.

Figures 14, 15:
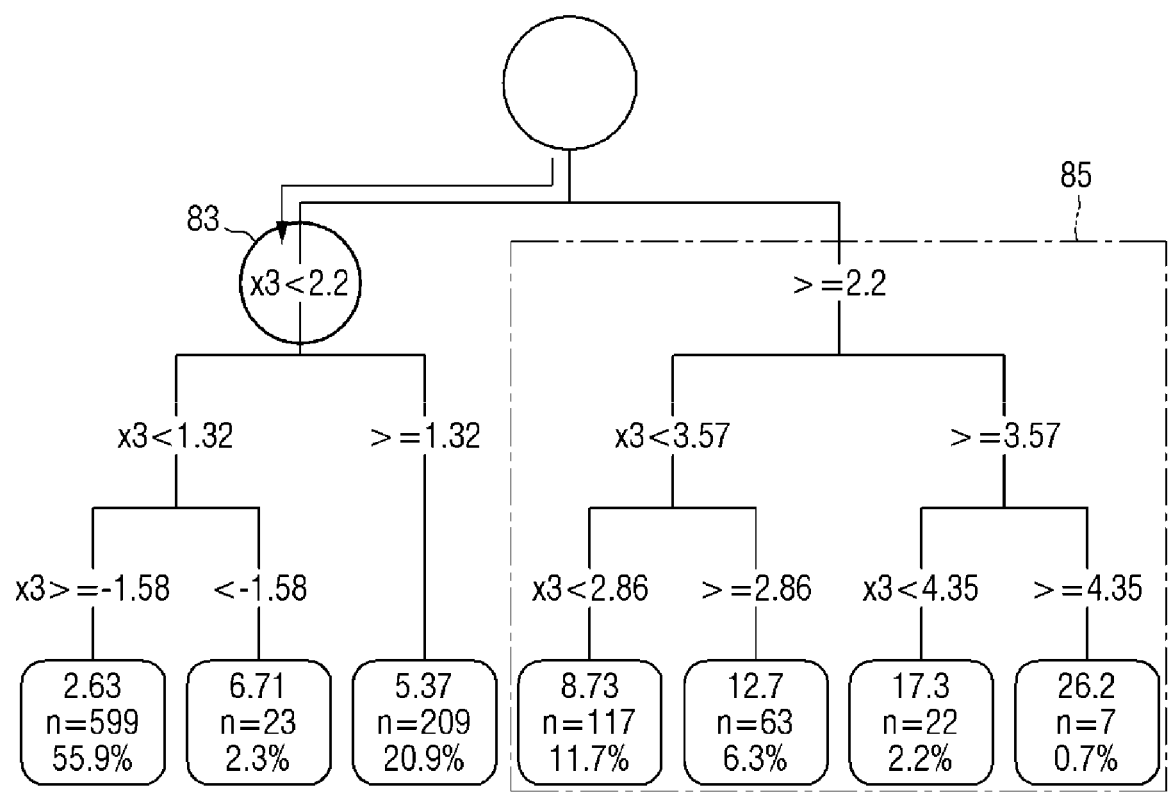

In an embodiment, the process management apparatus 100 may select tree nodes by further considering the number of pieces of observed data corresponding to each tree node and generate a normal ruleset or an abnormal ruleset based on the selected tree nodes. For example, the process management apparatus 100 may generate a normal ruleset based on tree nodes whose corresponding averages and degrees of deviation of dissimilarity values are equal to or less than threshold values and whose numbers of pieces of observed data are equal to or greater than a threshold value. This is because the smaller the average and degree of deviation of dissimilarity values and the greater the number of pieces of observed data, the better the observed data represents a normal pattern. In another example, the process management apparatus 100 may select tree nodes based on the weighted sum of the average and degree of deviation of dissimilarity values and the number of pieces of observed data and generate a normal ruleset and an abnormal ruleset based on the selected tree nodes. FIGS. 14 and 15 illustrate an example of generating an optimal ruleset according to the current embodiment.

Specifically, FIG. 14 illustrates a regression tree constructed in a case where a third process factor X3 has a highest individual influence index from among three process factors X1, X2 and X3 set as independent variables. The values shown in a tree node of the regression tree illustrated in FIG. 14 are an average dissimilarity value (2.63) based on the $T^2$ statistic, the number of pieces of observed data (559) and a ratio (55.9%), respectively. Intermediate nodes are not illustrated for ease of description.

Referring to FIG. 14, when tree nodes are selected in consideration of the average and degree of deviation of dissimilarity values and the number of pieces of observed data corresponding to each tree node included in the regression tree, a tree node 83, which is not a terminal node, is selected as a node for generating an optimal ruleset. An optimal ruleset 87 generated based on the tree node 83 is shown in FIG. 15.

Figures 16, 17:
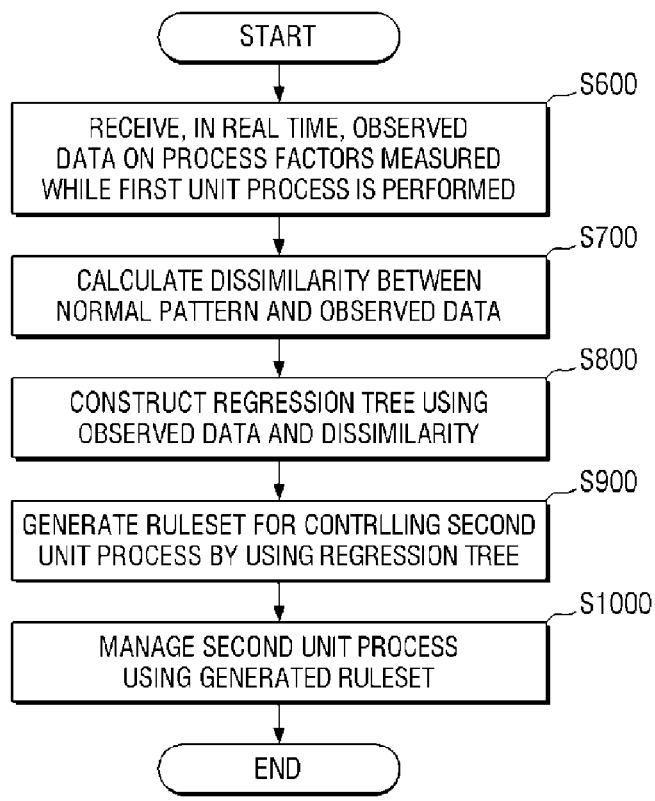
FIG. 17 is a second flowchart illustrating a process management method according to an embodiment of the inventive concept.

In addition, FIGS. 14 and 16 illustrate an example of generating an abnormal ruleset based on tree nodes 85 whose averages of dissimilarity values exceed a preset control limit or a predetermined threshold value. An example of the generated abnormal ruleset is shown in FIG. 16.

In the embodiments described so far, it is assumed that all the tree nodes included in a regression tree are searched in order to select a tree node serving as a basis for generating an optimal ruleset. However, according to an embodiment of the inventive concept, the search may be performed in a direction from an upper layer toward a lower layer of the regression tree so that a value calculated according to Equation 3 below is minimized.

In Equation 3, c-1 indicates a node (e.g., a parent node) of an upper layer, and c indicates a node (e.g., a child node) of a lower layer. In addition, xc indicates an average dissimilarity value of a tree node C, ssc indicates the variance of dissimilarity values, nc indicates the number of pieces of observed data (coverage), and W indicates a weight value. The weight value may be an experimentally determined value. However, if the reliability of a rule is important, a relatively high weight value may be given to the variance.

$$\operatorname{argmin}_c \left[ Wx \frac{\overline{x}_c}{\overline{x}_{c-1}} + Wss \frac{ss_c}{ss_{c-1}} + Wn \left(1 - \frac{n_c}{n_{c-1}}\right) \right] \quad (3)$$

where $$\sum W = 1.$$

Referring to Equation 3, it can be understood that a search is performed in a direction from the upper node c-1 to the lower node c which has a smaller average and variance of dissimilarity values than the upper node c and whose number of pieces of observed data is slightly different from that of the upper node c from among a plurality of lower nodes.

For specific example, in the regression tree illustrated in FIG. 11 and FIG. 13, a search direction may be determined to be a direction from a root node to a node having a smaller value calculated according to Equation 3 between a left child node and a right child, node of the root node. Here, the process management apparatus 100 proceeds to search the left child node with a smaller average dissimilarity value and a larger number of pieces of observed data.

Until now, the method of providing guide information for a target process based on a regression tree has been described with reference to FIGS. 12 through 16, According to the above-described method, the individual influence index of each process factor can be calculated based on the order in which the process factors are used to divide tree nodes of the regression tree. Therefore, it is possible to provide identification information of a process factor that has a major influence on the abnormal state of the target process. This makes effective process management possible. In addition, intuitive guide information such as major process factors, a normal ruleset and an abnormal ruleset can be provided to the administrator based on the regression tree. Therefore, the convenience of the administrator performing process management can be increased. Furthermore, the guide information is used as recipe optimization logic of process equipment, thereby contributing to improvement of product quality and yield.

A process management method according to an embodiment of the inventive concept will now be described with reference to FIG. 17.

According to the embodiment of the inventive concept, the process management apparatus 100 may automatically control a target process using a ruleset venerated as described above. More specifically, when the same unit process is repeated, the process management apparatus 100 may construct a regression tree based on observed data of a first unit process, generate a ruleset for managing a unit process based on the regression tree, and automatically manage a second unit process, which is a unit process subsequent to the first unit process, using the ruleset.

Referring to the flowchart illustrated in FIG. 17, the process management apparatus 100 receives, in real time, observed data on process factors measured while a first unit process is performed and constructs a regression tree for the first unit process based on the observed data (operations S600, S700 and S800). A description of operations S600, S700 and S800 is omitted in order to avoid redundancy.

Next, the process management apparatus 100 generates a ruleset for controlling a second unit process performed after the first unit process by using the regression tree (operation S900). For example, according to the above-described embodiments, the process management apparatus 100 may generate a normal ruleset including an optimal ruleset and an abnormal ruleset indicating an abnormal state.

Next, the process management apparatus 100 manages the second unit process using the generated ruleset (operation S1000). For example, the process management apparatus 100 may control process factors of the second unit process according to the range of process factors included in the optimal ruleset. In another example, the process management apparatus 100 may detect the abnormal state of the second unit process using the abnormal ruleset and alert the administrator.

Until now, the process management method according to the embodiment of the inventive concept has been described with reference to FIG. 17. According to the above-described method, a normal ruleset indicating the normal state of a target process can be generated based on a regression tree, and optimization of the target process can be automatically performed using the normal ruleset. Accordingly, this can increase the convenience of process management and improve the quality and yield of products, particularly in the field of production process. In addition, an abnormal ruleset indicating the abnormal state of the target process can be generated based on the regression tree, anti an abnormality in the target process can be accurately detected using the abnormal ruleset.

The concepts of the invention described above with reference to FIGS. 1 to 17 can be embodied as computer-readable code on a computer-readable medium. The computer-readable medium may be, for example, a removable recording medium (a CD, a DVD, a Blu-ray disc, a USB storage device, or a removable hard disc) or a fixed recording medium (a ROM, a RAM, or a computer-embedded hard disc). The computer program recorded on the computer-readable recording medium may be transmitted to another computing apparatus via a network such as the Internet and installed in the computing apparatus. Hence, the computer program can be used in the computing apparatus.

Although operations are shown in a specific order in the drawings, it should not be understood that desired results can be obtained when the operations must be performed in the specific order or sequential order or when all of the operations must be performed. In certain situations, multitasking and parallel processing may be advantageous. According to the above-described embodiments, it should not be understood that the separation of various configurations is necessarily required, and it should be understood that the described program components and systems may generally be integrated together into a single software product or be packaged into multiple software products.

While the present invention has been particularly illustrated and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of managing a target process in a semiconductor field using a process management apparatus comprising at least one processor, the method comprising:
generating a reference pattern that indicates a normal state based on reference data about a first process factor among a plurality of process factors associated with a target process, the first process factor measured while the target process is maintained in the normal state;
obtaining observed data, collected by at least one sensor, on the first process factor measured for an observation period in a first unit process of the target process;
calculating a dissimilarity between the reference pattern and the observed data;
constructing a regression tree for the target process by using the observed data and the dissimilarity, wherein the first process factor is set as an independent variable of the regression tree, and the dissimilarity is set as a dependent variable of the regression tree;
generating a ruleset by using the regression tree, wherein the ruleset comprises at least one of a first ruleset indicating the normal state of the target process or a second ruleset indicating an abnormal state of the target process; and providing, via a user interface, information on the generated ruleset, and controlling a value of a second process factor, of a second unit process that is performed subsequent to the first unit process, among the plurality of process factors based on the generated ruleset.

2. The method of claim 1, wherein the generating of the reference pattern comprises:
updating the reference data to data that is more recent than the reference data; and
generating the reference pattern again by using the updated reference data.

3. The method of claim 1, wherein the process factor is provided in plural numbers, and the dissimilarity is calculated based on Hotelling's T-squared (T2) statistic.

4. The method of claim 1, wherein the observed data comprises first observed data observed when the target process is in the normal state and second observed data observed when the target process is in the abnormal state.

5. The method of claim 1, wherein the constructing of the regression tree comprises selecting abnormal observed data, the abnormal observed data comprising dissimilarity values exceeding a preset control limit, from the observed data and constructing the regression tree for the target process by using the abnormal observed data and the dissimilarity values of the abnormal observed data.

6. The method of claim 1, wherein the generating the ruleset comprises:
generating the ruleset based on one or more tree nodes selected from tree nodes included in the regression tree, and
wherein the selected tree nodes are not terminal nodes.

7. The method of claim 1, wherein the ruleset further comprises a third ruleset indicating an optimal state of the target process, and the generating the ruleset comprises:
selecting a tree node with a corresponding average dissimilarity value that is smallest among the tree nodes included in the regression tree;
generating the third ruleset indicating the optimal state of the target process based on the selected tree node.

8. The method of claim 1, wherein the generating the ruleset comprises:
selecting one or more tree nodes from tree nodes included in the regression tree based on an average and degree of deviation of dissimilarity values corresponding to each tree node;
generating the first ruleset indicating the normal state of the target process based on the selected one or more tree nodes.

9. The method of claim 8, wherein the selecting of the one or more tree nodes from the tree nodes included in the regression tree comprises selecting the tree nodes based on a number of pieces of observed data corresponding to each tree node.

10. The method of claim 8,
wherein the target process includes a first unit process and a second unit process,
wherein the observed data is observed data on the first unit process, and
wherein the generated ruleset comprises the first ruleset, which includes a first range of process factor values indicating the normal state,
wherein the controlling the second process factor based on the generated ruleset comprises, controlling a value associated with the second process factor to be included in the first range of process factor values while the second unit process is performed.

11. The method of claim 1, wherein the generating the ruleset comprises:
selecting first tree nodes with corresponding average dissimilarity values equal to or less than a first threshold value from tree nodes included in the regression tree, and generating the first ruleset indicating the normal state of the target process based on the first tree nodes; and/or
selecting second tree nodes with corresponding average dissimilarity values equal to or greater than a second threshold value from the tree nodes included in the regression tree, and generating the second ruleset indicating the abnormal state of the target process based on the second tree nodes.

12. The method of claim 1, wherein the generating the ruleset based on the regression tree comprises:
selecting a tree node with corresponding average dissimilarity values exceeding a preset control limit from tree nodes included in the regression tree;
generating the second ruleset indicating the abnormal state of the target process based on the selected tree nodes.

13. The method of claim 1,
wherein the second process factor comprises a third process factor and a fourth process factor,
wherein the regression tree comprises a plurality of layers comprising a first layer and a second layer,
wherein tree nodes located in the first layer are divided by the first process factor, tree nodes located in the second layer are divided by the second process factor, and the first layer is a layer higher than the second layer,
wherein the controlling the second process factor based on the regression tree comprises:
assigning respective priorities to the third process factor and the fourth process factor such that the third process factor has higher priority than the fourth process factor; and
controlling the second process factor by adjusting the third process factor and the fourth process factor according to the respective priorities.

* * * * *